United States Patent [19]

Antia

[11] Patent Number: 5,677,919
[45] Date of Patent: Oct. 14, 1997

[54] FASTER LINEAR BLOCK DECODING APPARATUS AND METHOD FOR RECEIVERS IN DIGITAL CELLULAR COMMUNICATION AND OTHER SYSTEMS

[75] Inventor: Yezdi Antia, Gaithersburg, Md.

[73] Assignee: Hughes Electronics, Los Angeles, Calif.

[21] Appl. No.: 257,967

[22] Filed: Jun. 10, 1994

[51] Int. Cl.$^6$ .................................................. G06F 11/10
[52] U.S. Cl. ........................................ 371/37.1; 371/37.7
[58] Field of Search ............................ 371/37.1, 37.4, 371/37.5, 37.7, 40.1, 38.1, 37.6, 39.1

[56] References Cited

U.S. PATENT DOCUMENTS

| | | | |
|---|---|---|---|
| 5,003,539 | 3/1991 | Takemoto et al. | 371/37.1 |
| 5,329,535 | 7/1994 | Coker | 371/39.1 |
| 5,331,645 | 7/1994 | Miller et al. | 371/37.1 |
| 5,361,266 | 11/1994 | Kodama et al. | 371/37.7 |
| 5,367,563 | 11/1994 | Sainton | 379/98 |

FOREIGN PATENT DOCUMENTS

| | | |
|---|---|---|
| A-0 154 538 | 9/1985 | European Pat. Off. . |
| A-0 167 627 | 1/1986 | European Pat. Off. . |
| A-0 340 139 | 11/1989 | European Pat. Off. . |
| A-0 489 993 | 6/1992 | European Pat. Off. . |

OTHER PUBLICATIONS

U. Dettmar et al., *Electronics Letters*, 1 Nov. 1993, vol. 29, No. 23, pp. 2024–2025.

*Primary Examiner*—Reba I. Elmore
*Assistant Examiner*—Thomas E. Brown
*Attorney, Agent, or Firm*—John T. Welan; Wanda Denson-Low

[57] ABSTRACT

A receiver in a digital cellular communication system includes a system for receiving a signal transmitted in the cellular system and representing a code word encoded in a binary linear block code and a first digital signal processor for demodulating the signal and a second digital signal processor for decoding the binary linear block code in the demodulated signal. A system operates the digital signal processors to demodulate the code word partially and produce a demodulated portion of the code word, to provide a partial syndrome calculation to the demodulated portion of the code word as at least one additional portion of the code word is demodulated, and to apply an additional syndrome calculation to the at least one additional demodulated portion of the code word, and to combine the partial and additional syndrome calculations to provide a complete syndrome calculation. An output system then outputs decoded signals.

8 Claims, 4 Drawing Sheets

PRIOR ART METHOD:

INVENTION METHOD:

FASTER LINEAR BLOCK DECODING APPARATUS AND METHOD FOR RECEIVERS IN DIGITAL CELLULAR COMMUNICATION AND OTHER SYSTEMS

DESCRIPTION

The present invention relates to digital cellular communication systems and more particularly to binary linear cyclic block decoders employed in receivers in digital cellular base stations and mobile digital cellular units.

In cellular communication systems, encoding/decoding procedures are applied to transmitted voice and other data to reduce data errors. Prior to transmission from a mobile phone or from a base station, encoding is usually performed with either a block coding scheme or a trellis coding scheme. Trellis encoding is most commonly implemented by means of a convolutional scheme, and is best adapted for correcting random data errors.

In the prior art, the digital cellular system procedure for encoding messages at the sending end of the system may be a two step or a single step procedure. In the two step procedure, a message is first encoded using a cyclic redundancy code in an outer code loop and then encoded using a trellis or block code in an inner code loop. At the receiving end of the cellular system, the message is decoded using the inner loop code to eliminate as many errors as possible through forward error correction (FEC). In the single step procedure, only the trellis or block code is employed.

A linear block code is a collection of vector spaces over a finite field. In binary linear cyclic block codes, a syndrome calculation is performed using a polynomial. These codes are of the type where $GF(2^k)$, with $k>1$.

The most common binary linear block coding scheme is the Reed-Solomon (R-S) scheme which is best adapted for correcting burst data errors such as those that often occur in cellular communication channels as a result of Rayleigh fading. The BCH code is another common binary linear block coding scheme.

In the single step block coding procedure, where linear block coding such as the R-S scheme or the BCH scheme is employed, data bits are encoded and they together with parity bits form successive transmitted block signals. Block or R-S decoding is performed on received block signals, i.e., data bits are detected in each block and FEC is applied to remove errors within the capability of the decoder. Resultant decoded signals are transmitted for voice output in voice systems or for data output in data transmission systems.

In single step or two step coding schemes, linear block or R-S decoding procedures normally include, as already indicated, a syndrome calculation as a first decoding step and an error detection and correction as a second and last step. Such block decoding procedures are applicable to linear block decoders in digital cellular communication systems as well as other products in which such decoders may be employed.

Generally, it is desirable that the decoding procedure be performed as rapidly as possible. In product applications, such as digital cellular data transmission systems, where especially fast demodulation and decoding are required, it is desirable from cost and performance standpoints that demodulation and decoding be performed with commonly used digital signal processors as opposed to resorting to special, high speed block or R-S decoder chips.

However, in the conventional method for block or R-S processing in a receiver, a complete received codeword is first demodulated and then decoded. As a result, the total processing time is the sum of the demodulation and decoding times, which may be excessive especially in cellular digital packet data (CDPD) applications. Accordingly, the prior art has been deficient in this respect and a need has existed to provide faster generation of decoded outputs in digital cellular systems in which a block coding scheme is used.

SUMMARY OF THE INVENTION

The present invention is directed to achieving faster linear block decoding with one or more digital signal processors in digital cellular communication and other apparatus. Computation parallelism is employed to achieve this purpose. A receiver comprises a system for receiving and demodulating a signal representing a code word encoded in a binary linear block code and a decoder for decoding the binary linear block code in the demodulated signal. A system operates the receiving and demodulating system and the decoder to demodulate the code word partially and produce a demodulated portion of the code word, to provide partial decoding of the demodulated portion of the code word as at least one additional portion of the code word is demodulated, and to decode the code word fully when the entire code word is demodulated. An output system then outputs the decoded signals.

BRIEF DESCRIPTION OF THE DRAWINGS

The accompanying drawings, which are incorporated in and constitute a part of this specification, illustrate a preferred embodiment of the invention and together with the description provide an explanation of the objects, advantages and principles of the invention. In the drawings.

DETAILED DESCRIPTION OF THE INVENTION

The conventional method of binary linear block code or R-S code processing in a receiver is first to demodulate a complete received codeword before any syndrome calculation is performed. Thus, the total time required to decode the complete R-S block occurs after the time the demodulation of the R-S block is completed.

The present invention provides faster binary linear block decoding by introducing parallelism between the demodulation and the decoding subprocesses. Since syndrome calculation is a significant part of the total decoder computation and has to be completed before proceeding with other steps in the block decoder, the invention performs a partial syndrome calculation on a partially received codeword. The partial syndrome calculation is done in parallel with the demodulation process, thereby reducing the decode time required once the block demodulation is completed. As a result, the total time for demodulation and decoding is reduced to enable use of digital signal processors in data communication and other systems where fast demodulation and decoding processing is required or desirable.

In the prior art, the complete codeword has to be received and demodulated before the complete syndrome calculation is performed for decoding. As a result, processing resources may be kept idle. The present invention maximizes the use of processing resources while meeting stringent decoding time requirements.

Figure 1:
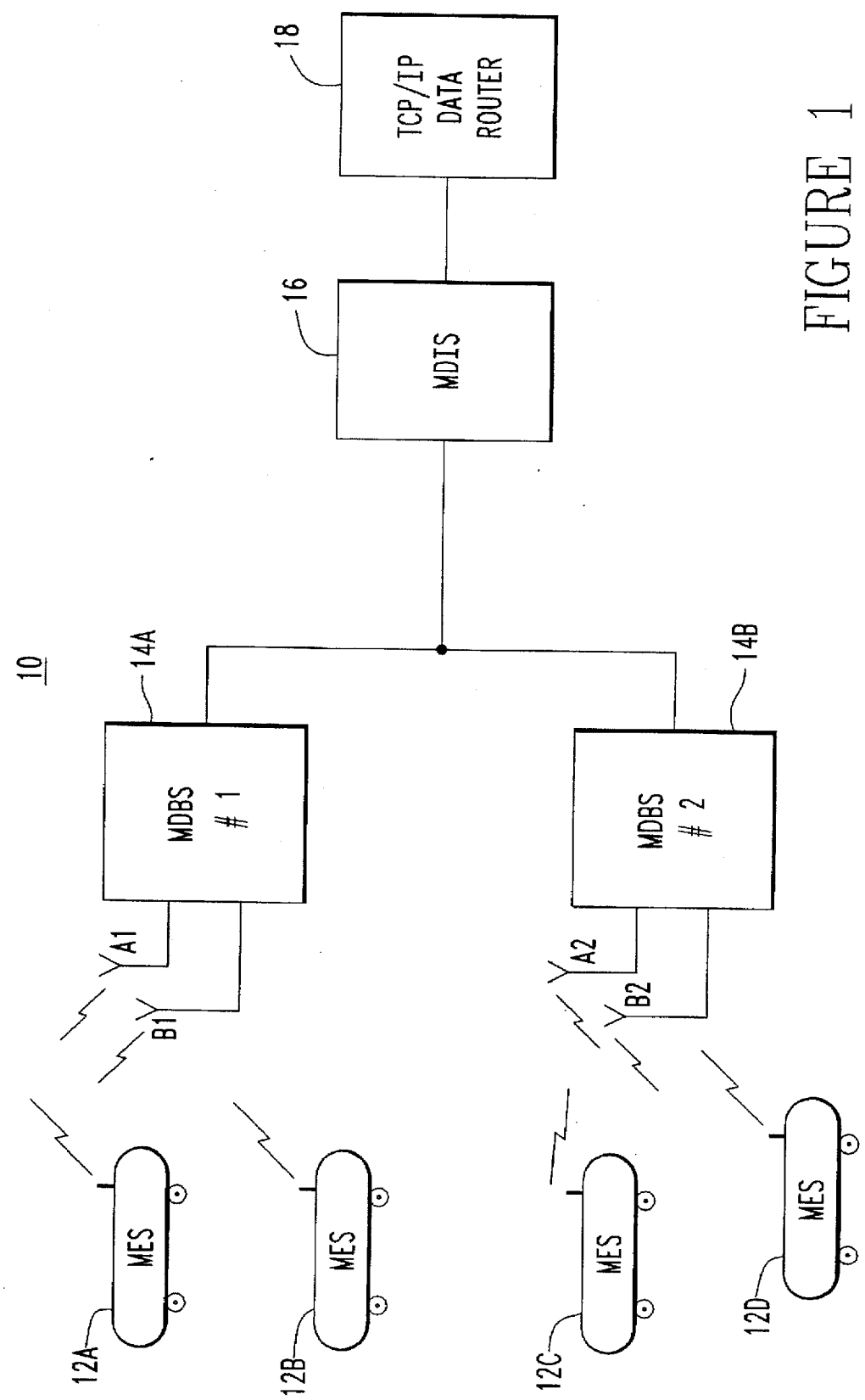
FIG. 1 shows a block diagram for a digital cellular communication system in which the present invention is embodied in its preferred form.

More particularly, a digital cellular communication system 10 is shown in FIG. 1 in which a preferred form of the present invention is embodied. The system 10 is operative in a defined geographic region such as all or part of a metropolitan area. Further, in this case, the system 10 is in the form of a CDPD system which may be part of a Digital Cellular System.

CDPD specifications require that R-S decoding be completed prior to a second microslot after a block is received. After providing for various hardware and processing delays, the decoder thus has approximately 5 microseconds to generate a decoded output. The present invention achieves faster decoding output thereby enabling decoding for CDPD and other systems with a DSP as opposed to a high speed R-S decoder chip.

The cellular system 10 includes mobile end systems (MES), as represented by four illustrated MES 12A through 12D. Communication links may be established between the MES 12A–12D and a mobile data base station (MDBS) for the communication cell within which the MES may be located. In this illustrative case, two MDBS 14A and 14B are shown.

Respective pairs of diversity antennae A1, B1 and A2, B2 are provided at the MDBS 14A and 14B, respectively, to provide for receiving diversity signals from a transmitting MES.

In the present embodiment, the single step block encoding scheme is employed in structuring the received signals prior to transmission. R-S encoding is the preferred block encoding scheme.

A mobile data intermediate system (MDIS) 16 provides system management functions through regulation of the operation of the MDBS 14A and 18B and by establishing communication links through a data router 18 employing transmission control protocol/internet protocol (TCP/IP).

Figure 2:
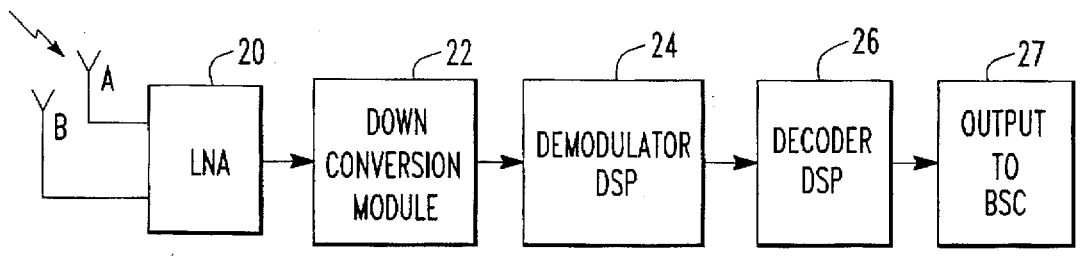
FIG. 2 shows a subsystem block diagram for base station receiver circuitry employed in the system of FIG. 1.

As shown in FIG. 2, circuitry for the MDBS 14A or 14B includes an RF receiver having a low noise amplifier 20 that receives signals from diversity antennae A and B. Next, a down-conversion module 22 provides signal downconversion from RF to the baseband and then provides analog-to-digital conversion through a signal sampling procedure.

The output digital signal from the downconversion module 22 is applied to a demodulator 24, preferably in the form of a digital signal processor (DSP), where the originally modulated signal is demodulated. GMSK coherent demodulation is employed in the present case. The demodulator output is coupled to a decoder 26 which is also preferably in the form of a DSP.

The demodulator 24 is structured in accordance with the present invention to operate with the decoder 26 in providing demodulation and faster binary linear block decoding. In other applications of the invention similar cooperation can be employed between demodulator and decoding subprocesses in a single DSP if the DSP has sufficient computing capacity.

Figure 3A:
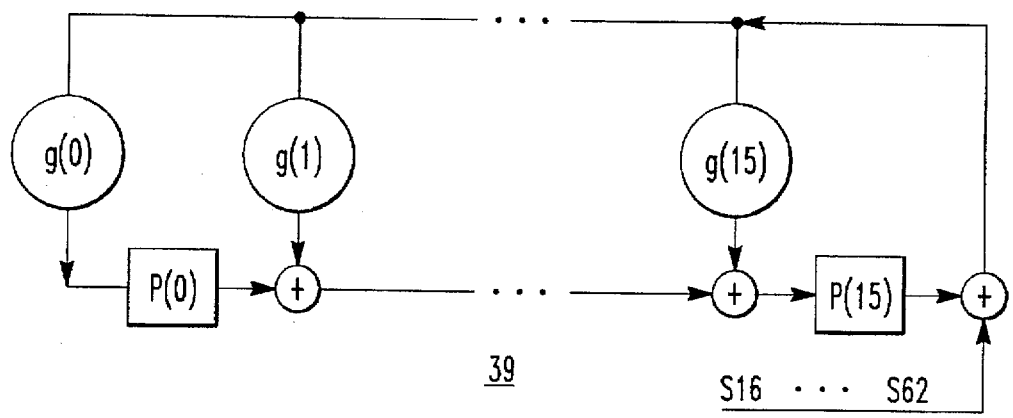
FIG. 3A shows a shift register implementation of an R-S encoder employed to produced encoded blocks received by the receiver circuitry of FIG. 2.
Figure 3B:
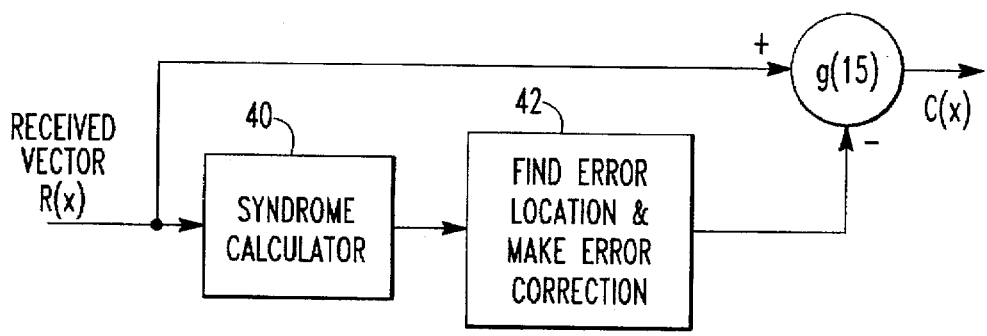
FIG. 3B is a block diagram that generally represents an R-S decoding procedure used in the receiver circuitry of FIG. 2.

The R-S encoding/decoding employed in the present embodiment is represented in FIGS. 3A and 3B to provide a better understanding of the invention. Thus, the systematic R-S code is an (N, k) code generated over a $GF(2^6)=GF(64)$, where N is the number of symbols and (N–k) is the number of parity symbols, and, specifically N=63 and k=47.

The $GF(2^6)$ is defined with 8,1 as its primitive element under an irreducible polynomial $1+X+X^6$.

The generator polynomial is defined as:

$$g(x) = x^{16} + \alpha^{28}x^{15} + \alpha^{41}x^{14} + \alpha x^{13} + \alpha^{16}x^{12} + \alpha^{24}x^{11} +$$
$$\alpha^{54}x^{10} + \alpha^{33}x^9 + \alpha^{38}x^8 + \alpha^{50}x^7 + \alpha^{25}x^6 + \alpha^{12}x^5 +$$
$$\alpha^{21}x^4 + \alpha^{23}x^3 + \alpha^{17}x^2 + \alpha^{21}x + \alpha^{10}$$

The encoding is performed by generating the parity symbols or the remainder r(x).

$$x^{16}*m(x)/g(x)=q(x)+r(x)/g(x)$$

If the 63 R-S symbols are denoted by $\{S_i\}$, i=0,62, the information symbols are $S_{62}$ to $S_{16}$ and the parity symbols are $S_{15}$ to $S_0$.

The DSP 24 performs the block demodulation while the DSP 26 is used as the decoder. Preferably, once ⅔ of the R-S block has been demodulated by the DSP 24, the R-S symbols are transferred to the decoder DSP 26 which begins a partial syndrome calculation for that received block. Once the remainder of the block has been demodulated, it is also transferred to the decoder DSP 26 which performs the second partial syndrome calculation before combining the results of the partial calculation. Once the completed syndrome is calculated the rest of the decoding proceeds in the normal manner.

FIG. 3A shows a shift register 39 employed to implement the R-S encoder. As shown in FIG. 3B, decoding is performed in two basic steps, i.e., syndrome calculations, as indicated by block 40, and error detection and correction as indicated by block 42. The portion of the decoding procedure employed in the block 42 may be a conventional procedure available in prior art publications.

In syndrome calculations, a received word r may contain an error pattern e. Then r may be written $$r=c+e$$

If the received word r is multiplied by a parity check matrix H, the resultant vector s (called the syndrome) is $$s = Hr$$
$$= Hc + He$$
$$= He$$

FIG. 3B shows the decoding procedure employed. Besides the syndrome calculation which is the heart of the invention, the remainder of the decoding procedure is standard and can be found in many textbooks and papers.

The following steps are employed in the overall RS decoding procedure. In this example, decoding is performed for a (64,47) RS decoder with erasures:

1. Calculate the syndrome in accordance with the invention.
2. Calculate a Forney Syndrome and an Erasure Locator Polynomial.
3. The Forney Syndrome is then input to the Key Equations which are calculated using the Euclid Algorithm. The output of the Key Equations is the Errata Locator Polynomial and the Errata Evaluator Polynomial.
4. The inverse roots of the Errata Locator Polynomial gives the location of the errors and the erasures. This is done by using the Chien Search Algorithm.
5. Knowing the locations of the errors/erasures, the Errata Magnitude is evaluated and then subtracted from the received vector to give the transmitted code word.

Figure 4:
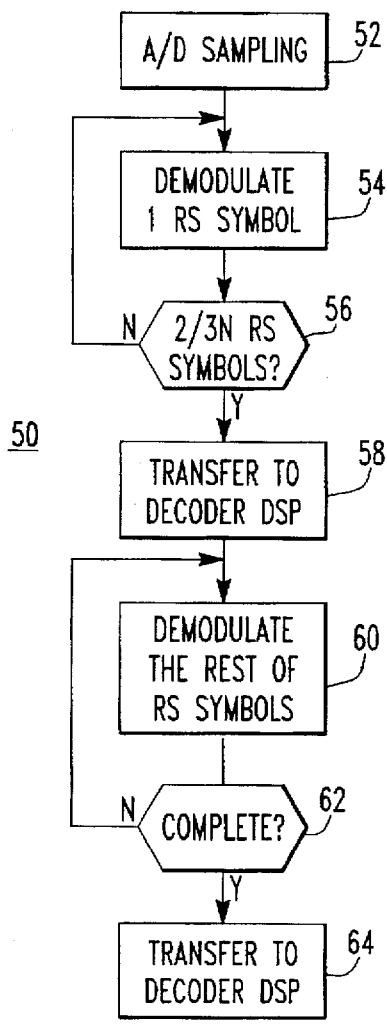
FIG. 4 is a logic flow diagram for a demodulation procedure employed in a digital signal processor in the receiver circuitry of FIG. 2.
Figure 5:
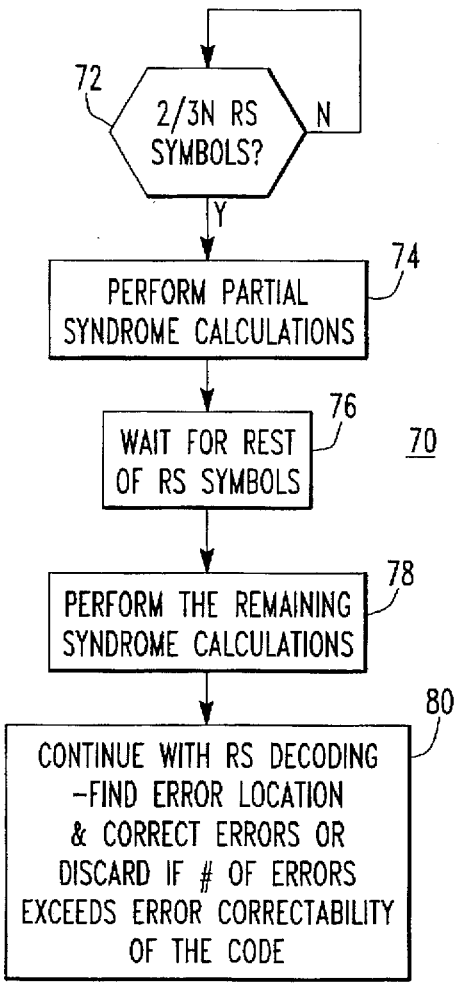
FIG. 5 is a logic flow diagram for a decoding procedure employed in another digital signal processor in the receiver circuitry of FIG. 2.

The cooperative operation of the demodulator 24 and the decoder 26 is illustrated by the flow diagrams shown in FIGS. 4 and 5. Generally, the invention divides the R-S syndrome calculation into a partial syndrome calculation on a partially received codeword and a subsequent partial syndrome calculation on the rest of the received codeword. This procedure shortens the time required to decode an R-S or other block in a CDPD or other system.

Thus, in a demodulation subprocess 50 shown in FIG. 4, analog-to-digital sampling is first provided by a block 52. Block 54 then demodulates one R-S symbol in a R-S block, and test block 56 determines whether demodulation has been partially completed to a threshold level, in this case a ⅔ block level. If not, demodulation of the R-S block continues.

In this case, when ⅔ of the R-S block is demodulated, block 58 transfers the partial demodulation data from the demodulator DSP 24 to the decoder DSP 26. In a decoding procedure 70 in the DSP 26 (FIG. 5), block 72 waits for a transfer of the partial demodulation data for the R-S block, and, once such data is received, block 74 performs a partial syndrome calculation in accordance with equations subsequently set forth herein. In these equations, the R-S code for this embodiment is defined by N=63 (where N is the number of symbols in an R-S block) and k=47 (where N-k is the number of parity symbols in an R-S block), with a Galois Field (GF) of $2^6$ or 64. Each R-S symbol thus contains 6 bits.

Once the partial syndrome calculation is performed, block 76 causes the decoder DSP 26 to wait for the rest of the demodulation data for the R-S block. In the meantime, block 60 (FIG. 4) demodulates the rest of the R-S block, and test block 62 determines when the demodulation is completed. At that time block 64 transfers the rest of the demodulation data for the R-S block from the demodulator DSP 24 to the decoder DSP 26.

The block 78 (FIG. 5) detects the transfer of the rest of the demodulation data and then performs the rest of the syndrome calculation for the R-S block. Output block 80 finds error locations in the decoded R-S block, corrects the errors, and returns program execution to the starting block 52 in the demodulator DSP 24 to process the next R-S symbol in the manner just described. If the number of errors in a decoded block exceeds the correctability of the block code, the block is discarded.

In the conventional syndrome calculation in R-S block decoding, an (N,k) codeword is R-S decoded as follows:

$$R(x) = \sum_{i=0}^{N-1} c_i x^i \text{ be the received message.}$$

There are 2t syndromes where 2t=N−k. The syndromes are given by $S_i$ and $S(x)$ in the syndrome polynomial.

$$S_i = R(\alpha^i) = \sum_{j=0}^{N-1} c_j \alpha^{ij} \text{ for } i=1, \ldots 2t.$$

$$S(x) = \sum_{i=1}^{2t} S_i x^{i-1}$$

In accordance with the present invention, a partial syndrome calculation is performed during demodulation as indicated above. Thus, considering the same R-S decoding of the (N,K) codeword:

$$R(x) = \sum_{i=0}^{N-1} c_i x^i = R_l(x) + x^l R_m(x)$$

where $R_l = \sum_{i=0}^{l-1} c_i x^i$ and $R_m = \sum_{i=0}^{m-1} c_{l+i} + x^i$ are the partially received codewords.

The length of l and m in the preferred embodiment of the invention is chosen as 42 and 21 respectively for a (63,47) R-S code.

The 2t partial syndromes for the partial received codeword $R_l$ are given by:

$$S'_i = R_l(\alpha^i) = \sum_{j=0}^{l} c_j \alpha^{ij} \text{ for } i=1,2 \ldots 2t.$$

The 2t partial syndromes for the partial received codeword $R_l$ are given by:

$$S''_i = R_m(\alpha^i) = \sum_{j=0}^{m} c_{l+j} \alpha^{ij} \text{ for } i=1,2 \ldots 2t.$$

The 2t syndromes are then calculated as follows.

$$S_i = S'_i + (\alpha^i)^l S''_i \text{ for } i=1,2 \ldots 2t$$

In general the received codeword may be divided into p partial codewords where p<N with a method similar to that described above used to calculate each partial syndrome and, finally, the whole syndrome. Each code word contains message data and parity, and is represented in polynomial form as previously indicated.

Figure 6A:
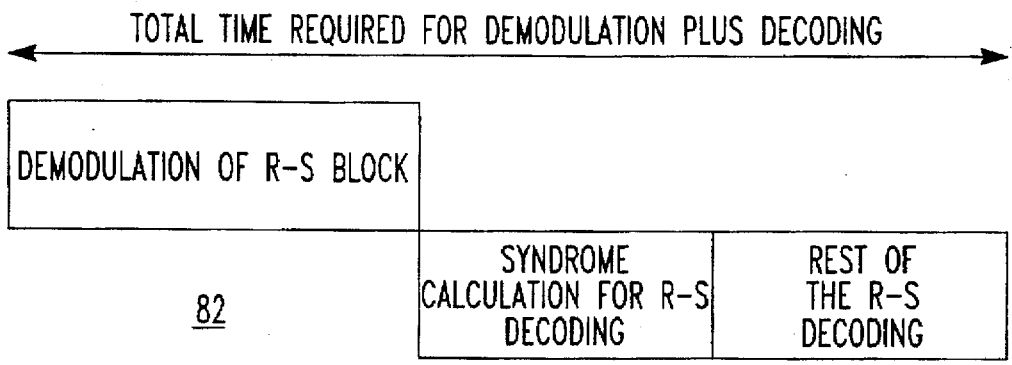
FIG. 6 is a chart that compares the time required to generate a decoded output in accordance with the invention to the time required by the prior art to generate a decoded output.
Figure 6B:
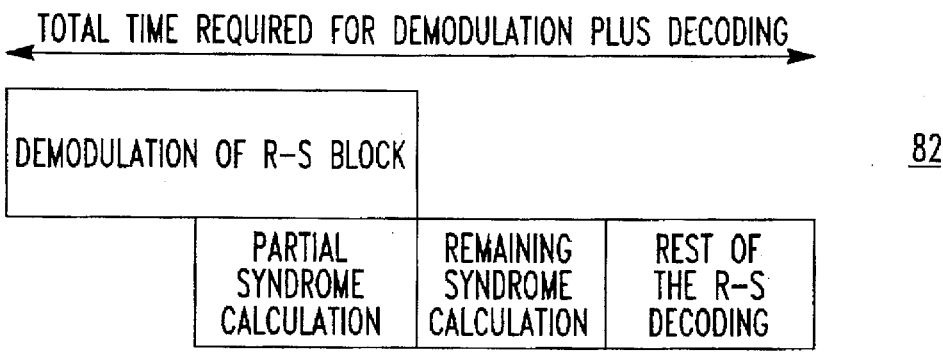

In the described embodiment, parallelism is used to improve data throughput. FIG. 6 illustrates the performance provided by the invention in the described embodiment. As shown, the total time for demodulation and decoding is greater for the prior art than it is for a receiver in which the invention is applied. The parallel syndrome calculation procedure indicated by block 82 provides the basis upon which faster decoding is achieved by the invention.

The foregoing description of the preferred embodiment has been presented to illustrate the invention. It is not intended to be exhaustive or to limit the invention to the form disclosed. In applying the invention, modifications and variations can be made by those skilled in the pertaining art without departing from the scope and spirit of the invention. It is intended that the scope of the invention be defined by the claims appended hereto, and their equivalents.

What is claimed is:

1. A receiver in a digital cellular communication system comprising:

a system for receiving and demodulating a signal transmitted in the cellular system and representing a code word encoded in a binary linear block code;

a decoder for decoding the binary linear block code of the demodulated signal;

a system for operating the receiving and demodulating system and the demodulator to demodulate the code word partially and produce a demodulated portion of the code word, to provide partial decoding of the demodulated portion of the code word while at least one additional portion of the code word is demodulated, and to decode the code word fully when the entire code word is demodulated; and an output system for outputting decoded signals, wherein the decoder decodes the linear block code by applying a syndrome calculation to the code word and thereafter detects and corrects errors in the code word; and the operating system applies a partial syndrome calculation to the demodulated portion of the code word and an additional syndrome calculation to the at least one additional demodulated portion of the code word and combines the partial and additional syndrome calculations to provide a complete syndrome calculation.

2. The receiver of claim 1 wherein only one additional portion of the code word is demodulated to complete the demodulation of the code word.

3. The receiver of claim 1 wherein:

the receiving and demodulating system includes a first digital signal processor for demodulating received signals;

the decoder includes a second digital signal processor which executes the decoding; and the operating system operates the digital signal processors and transmits signals between the digital signal processors to execute the demodulation and decoding of the code word.

4. The receiver of claim 3 wherein:

the binary linear code is the Reed-Solomon code;

the cellular communication system is a data communication system and successive code words represent transmitted data; and only one additional portion of the code word is demodulated to complete the demodulation of the code word.

5. A receiver in a digital cellular communication system comprising:

means for receiving and demodulating a signal transmitted in the cellular system and representing a code word encoded in a binary linear block code;

means for decoding the binary linear block code of the demodulated signal;

means for operating the receiving and demodulating system and the demodulator to demodulate the code word partially and produce partial decoding of the demodulated portion of the code word as at least one additional portion of the code word is demodulated, and to decode the code word fully when the entire code word is demodulated; and means for outputting the decoded signals, wherein the decoding means decodes the linear block code by applying a syndrome calculation to the code word and thereafter detects and corrects errors in the code word; and the operating means applies a partial syndrome calculation to the demodulated portion of the code word and an additional syndrome calculation to the at least one additional demodulated portion of the code word and combines the partial and additional syndrome calculations to provide a complete syndrome calculation.

6. The receiver of claim 5 wherein only one additional portion of the code word is demodulated to complete the demodulation of the code word.

7. A method for operating a receiver in a digital cellular communication system comprising the steps of:

receiving and demodulating a signal transmitted in the cellular system and representing a code word encoded in a binary linear block code;

decoding the binary linear block code of the demodulated signal;

performing the demodulating and decoding steps by demodulating the code word partially to produce a demodulated portion of the code word, partially decoding the demodulated portion of the code word as at least one additional portion of the code word is demodulated, and decoding the code word fully when the entire code word is demodulated; and outputting decoded signals, wherein the linear block code is decoded in the decoding step by applying a syndrome calculation to the code word and thereafter detecting and correcting errors in the code word; and a partial syndrome calculation is applied to the demodulated portion of the code word and an additional syndrome calculation is applied to the at least one additional demodulated portion of the code word, with the partial and additional syndrome calculations combined to provide a complete syndrome calculation.

8. The method of claim 7 wherein only one additional portion of the code word is demodulated to complete the demodulation of the code word.

* * * * *